United States Patent [19]

Neugebauer et al.

[11] Patent Number: 5,028,987
[45] Date of Patent: Jul. 2, 1991

[54] HIGH CURRENT HERMETIC PACKAGE HAVING A LEAD EXTENDING THROUGH THE PACKAGE LID AND A PACKAGED SEMICONDUCTOR CHIP

[75] Inventors: Constantine A. Neugebauer, Schenectady, N.Y.; Robert J. Satriano, Hackettstown, N.J.; James F. Burgess, Schenectady, N.Y.; Homer H. Glascock, II, Scotia, N.Y.; Victor A. K. Temple; Donald L. Watrous, both of Clifton Park, N.Y.

[73] Assignee: General Electric Company, Schenectady, N.Y.

[21] Appl. No.: 375,569

[22] Filed: Jul. 3, 1989

[51] Int. Cl.$^5$ .................... H01L 39/02; H01L 23/02; H01L 23/12; H01L 23/48
[52] U.S. Cl. ........................... 357/80; 357/68; 357/74; 174/52.4; 174/52.5; 361/392
[58] Field of Search .............. 357/68, 74, 80; 174/52.4, 52.5; 361/392, 417, 421

[56] References Cited

U.S. PATENT DOCUMENTS

| | | | |
|---|---|---|---|
| 3,218,524 | 11/1965 | Reintgen et al. | 357/80 |
| 3,576,474 | 4/1971 | Huber et al. | 357/74 |
| 3,740,619 | 6/1973 | Rosvold | 357/70 |
| 3,919,709 | 11/1975 | Koenig | 357/65 |
| 3,972,062 | 7/1976 | Hopp | 357/68 |
| 4,070,688 | 1/1978 | Wislocky | 357/68 |
| 4,604,644 | 8/1986 | Beckham et al. | 357/80 |
| 4,614,836 | 9/1986 | Carpenter et al. | 174/51 |
| 4,750,666 | 6/1988 | Neugebauer et al. | 228/160 |
| 4,845,545 | 7/1989 | Abramowitz et al. | 357/74 |

OTHER PUBLICATIONS

'Via Joint with Reduced Thermal Gradients', M. D. Reeber, IBM Tech. Disc. Bulletin, vol. 22, No. 2, Jul. '79, pp. 563-564.
Denning, Richard, "Improved Contact Means for Multi-Emitter Power Transistors", RCA Technical Notes, TN No. 851, mailed Oct. 16, 1969, pp. 1-3.

*Primary Examiner*—Rolf Hille
*Assistant Examiner*—David Ostrowski
*Attorney, Agent, or Firm*—Marvin Snyder; James C. Davis, Jr.

[57] ABSTRACT

A hermetic, high current package for a semiconductor device includes wide flat leads which are bonded to the contact pads of the device and formed to extend through apertures in an insulating lid. The lid is sealed to a base and the apertures around the leads are sealed with solder to provide the hermetic package. This package limits lateral current flow in the contact pads of the semiconductor device to relatively low levels which ensure the integrity of the contact pads.

25 Claims, 10 Drawing Sheets

HIGH CURRENT HERMETIC PACKAGE HAVING A LEAD EXTENDING THROUGH THE PACKAGE LID AND A PACKAGED SEMICONDUCTOR CHIP

RELATED APPLICATIONS

This application is related to application Ser. No. 07/367,525 filed Jun. 16, 1989 entitled "Hermetic Package Having a Lead Extending Through an Aperture in the Package Lid and a Packaged Semiconductor Chip" by V. A. K. Temple et al. This application is incorporated herein by reference.

BACKGROUND OF THE INVENTION

1. Field of the Invention

The present invention relates to the field of packages for semiconductor devices and packaged devices, and more particularly, to the field of high current hermetic packages and hermetically packaged high current devices.

2. Background Information

Semiconductor devices have been packaged in a vast variety of package configurations. These include both hermetic (gas-tight) and non-hermetic (gas-permeable) packages. As the desired operating frequency of a hermetically packaged power device increases, prior art packages begin to present problems. Prior art packages for power devices which are hermetically sealed generally include a metallic case or can. Such metallic cans have device leads which extend through glass seals in the sides of the can. These glass seals bond to both the material of the lead and the material of the can in order to provide the required hermetic seal. The chip in which the device is contained is bonded to the bottom of the can and the contact pads on the top of the device are connected to the through-the-can leads by wire bonds. After the completion of mounting and bonding the chip, a cover or lid is sealed on top of the can to hermetically seal the package. Such packages present a number of disadvantages. First, since the wire bonds are normally made with round wire on the order of about 1 mil (0.025 mm) in diameter for low power integrated circuits and 30–40 mils (0.76–1.02 mm) in diameter for power or high current devices and are about 0.3–0.5 inch (0.76–1.27 cm) long, they have a significant inductance in their own right. Second, the through-the-can leads are round wires about 20–50 mils (1–3 mm) in diameter and about 0.3–0.5 inches (0.76–1.27 cm) long. Thus, these leads also have a significant inductance in their own right. Third, the wires have a significant resistance which adds to the on-resistance of the device. Fourth, in order for the thermal expansion coefficient of the can and the semiconductor device to be sufficiently equal that the device does not become debonded from the can and to prolong the life of the glass seals, the cans are normally made of Kovar® or Invar® or other similar low thermal expansion coefficient metals. Such metals are magnetic materials and consequently, have the effect of increasing the inductance of the wire bonds and of the through-the-can leads. Fifth, the glass seals are unreliable over long periods of time and eventually leak. Sixth, the metals used in the can and leads suffer from higher electrical and thermal resistivity than copper. Seventh, such packages have the disadvantage that they are substantially larger in both major surface area and volume than the semiconductor chip and weigh many times what the chip weighs. The net result, is that the final packaged chip is in a heavy, bulky container which has a relatively high inductance. That relatively high inductance is undesirable for high frequency operation of the device, because when coupled with very the high di/dt characteristic of high frequency operation, this inductance leads to very large Ldi/dt voltage disturbances such as overshoots and undershoots, where L is the lead inductance. This problem increases with increasing frequency of operation because inductive effects increase with increasing signal frequency. Such hermetic cans also have the disadvantage that for large area contact pads on the semiconductor device, connection of that pad to the through-the-can lead by a single wire bond can result in excessive lateral currents in the contact pad of the semiconductor device. Consequently, multiple bonds need to be made to the contact pad to limit lateral currents to acceptable values for high current devices.

The above-identified related application discloses a package which overcomes the inductance and size problems of the prior art hermetic packages. However, the provisions of its preferred embodiment for limiting lateral current flow in the contact pad of the device can be improved upon.

There is a need for a compact, hermetic, nonmagnetic package for high frequency power devices which alleviates the problem of high lateral currents in the contact pads of power devices.

OBJECTS OF THE INVENTION

Accordingly, a primary object of the present invention is to provide a hermetically sealed package for a power semiconductor device which is lightweight, free of magnetic materials and prevents undesirable lateral current flow in contact pads of the semiconductor device.

SUMMARY OF THE INVENTION

The above and other objects which will become apparent from the remainder of the specification, including the drawings, are accomplished in accordance with the present invention by a semiconductor device package comprised of a base, a lid and a wide, flat electrode which extends through the lid and is bonded to the contact pad of the semiconductor device. The base and lid, when assembled, provide a cavity in which the semiconductor device is disposed. The wide, flat lead has a first portion which is disposed within that cavity and bonded to a contact pad on a first surface of the semiconductor device and a second portion which extends through an aperture in the lid. The lid is preferably of ceramic material and has metallization thereon surrounding the aperture through which the lead extends. This aperture is sealed with solder or with other appropriate material which forms a hermetic seal. A separate lead and aperture in the lid are preferably provided for each contact pad on the first surface of the device which is to be connected to circuitry external to the package cavity. Where the base of the package is electrically conductive, the base of the package may serve as a lead to the back side of the semiconductor chip.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
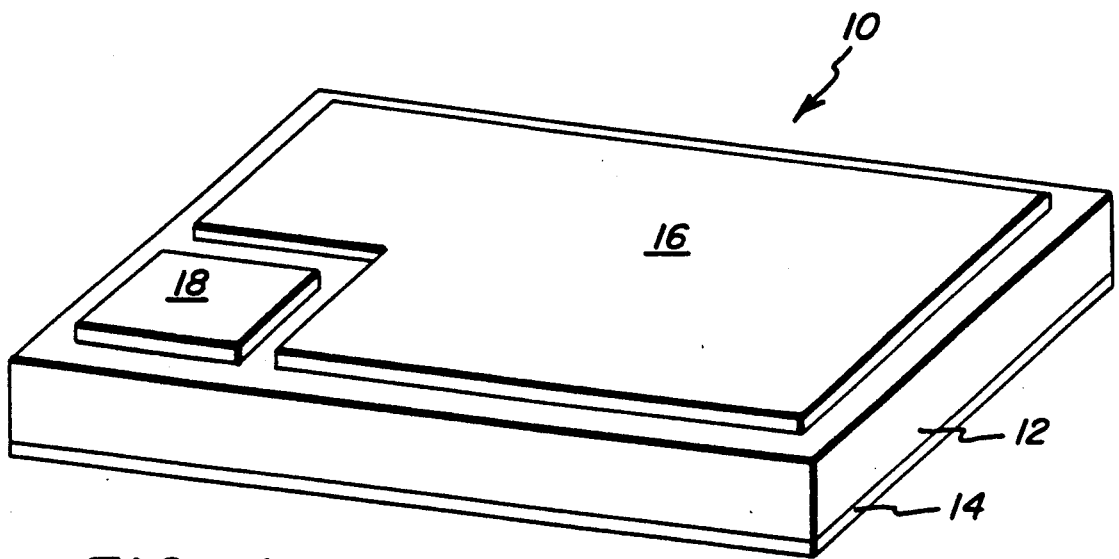
FIG. 1 is a perspective illustration of a semiconductor chip suitable for packaging in a package in accordance with the present invention.
Figure 2:
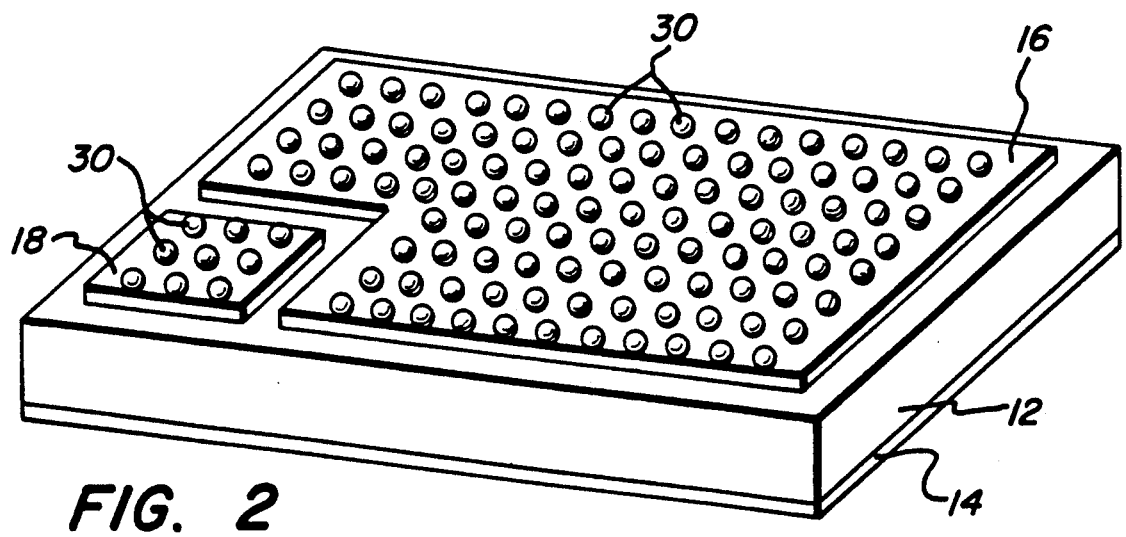
FIG. 2 illustrates the device of FIG. 1 ready for the bonding of leads or terminals thereto.

FIG. 1 is a perspective illustration of a semiconductor device 10 comprised of a body of semiconductor material 12 having a first uniform metallization 14 disposed in ohmic contact with its lower surface and having contact pads 16 and 18 disposed on its upper surface. In a power field effect device or an MCT (MOS controlled thyristor), the contact pad 16 and the metallization 14 are the power contacts for the device and the contact pad 18 is the gate or control electrode of the device. Where the contact pads 16 and 18 are non-solderable, it is preferred to form a plurality of gold conductive bumps 30 on each of the contact pads 16 and 18 (FIG. 2). In the illustrated embodiment these bumps 30 are distributed across the contact pad in a substantially uniform manner. Each of these gold bumps may preferably be formed in accordance with the teachings of U.S. Pat. No. 4,750,666 to Neugebauer et al., which is incorporated herein by reference. As is explained in more detail therein, a gold wire bonder is used to form these bumps. First, a gold ball is formed on the end of the gold wire and bonded to the contact pad 16 or 18 in the same fashion as it would be bonded thereto if a gold wire bond was being formed. However, once that bump has been bonded to the contact pad, rather than releasing the wire for movement through the bonding head as is done in forming a wire bond (while the bonding head moves to the location of the other end of the wire bond), the wire is held fixed and the bonding head is moved laterally to shear the wire from the bump. This leaves a bump with a substantially smooth upper surface. Alternatively, the wire may be broken by pulling vertically or melting. A pigtail of the wire may be left on the bump so long as it does not interfere with the subsequent steps in the fabrication process.

Conductive bumps other than gold may be employed if desired. Gold bumps are preferred at this time because of the well-established techniques for gold wire bonding which are easily modified to provide gold bumps in various locations, because of its solderability and because if thermocompression bonding is used to bond to the gold bumps, that thermocompression bonding is easier with gold bumps than with flat metallization. The use of gold bumps is also preferred because there is no yield loss at the wafer level. Alternatively, chromium copper metallization could be used (with its attendant yield loss during processing at the wafer level) to provide solderable contact pads.

The size of the gold bumps 30 is somewhat dependent on the diameter of the gold wire employed in creating the gold bumps. With 1 mil (0.025 mm) diameter gold wire, a bump about 3 mils (0.075 mm) in diameter at the pad surface and 1 mil (0.025) high is produced. The use of larger diameter wire provides a larger diameter, taller bump. The individual gold bumps 30 are preferably produced by an automatic wire bonding machine which has been programmed to position the bumps in the desired locations. A wire bonding machine such as the K&S Model 1419 is very effective for this purpose. The model 1419 is externally programmable with the program in use depending on the disk inserted in its disk drive. This machine is rated to produce two wire bonds per second and is capable of forming more gold bumps than that per second, since a wire bond involves separate bonding steps at its opposite ends. Thus, a very effective production process results, especially since use of gold bumps makes the provision of a solderable metallization on pads 16 and 18 unnecessary, thereby saving device fabrication steps. Other bonding machines may also be used.

Figure 3:
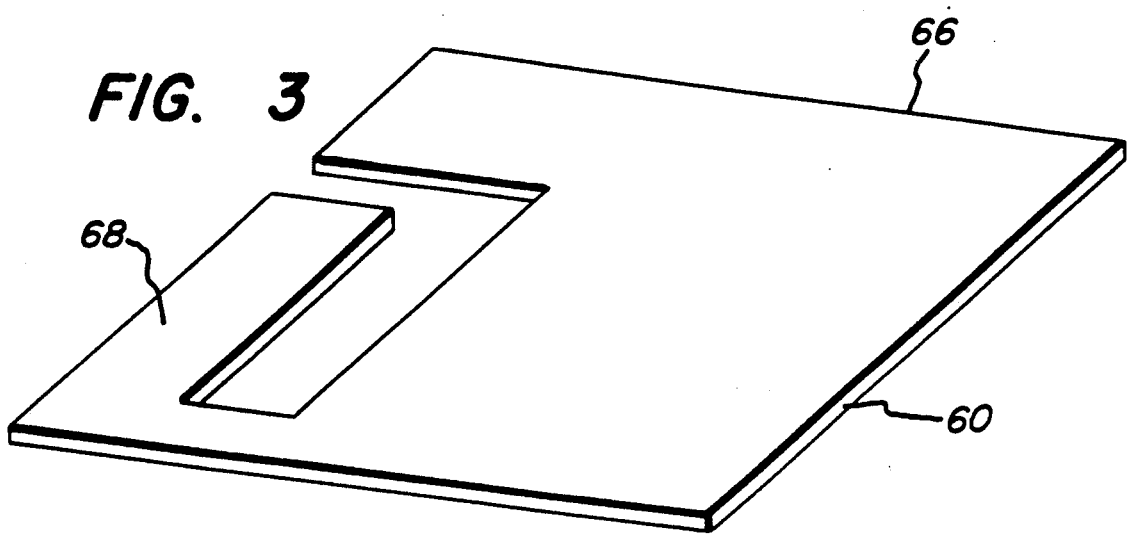
FIG. 3 is a perspective illustration of a lead frame for bonding to the upper surface of the device of FIG. 1.

FIG. 3 illustrates a lead frame 60 having two lead portions 66 and 68 which are configured to match the configuration of pads 16 and 18, respectively, on the chip 10. The lead frame 60 may preferably be between 1 and 10 mils (0.025 and 0.25 mm) thick and preferably about 5 mils (0.125 mm) thick. The lead portions of the frame may preferably be about 300 mils (7.6 mm) wide for the power lead and 100 mils (2.5 mm) wide for the control lead and about 325 mils (8.3 mm) long.

The lead frame 60 may preferably be a copper foil which is die cut or etched to form the lead frame. Such a copper foil is preferably about 5 mils (0.125 mm) thick and sufficiently flexible to allow flexing of the foil without a permanent bend being introduced. While the illustrated lead frame is designed for a single chip, a multiple chip frame may be used if desired.

Figure 4:
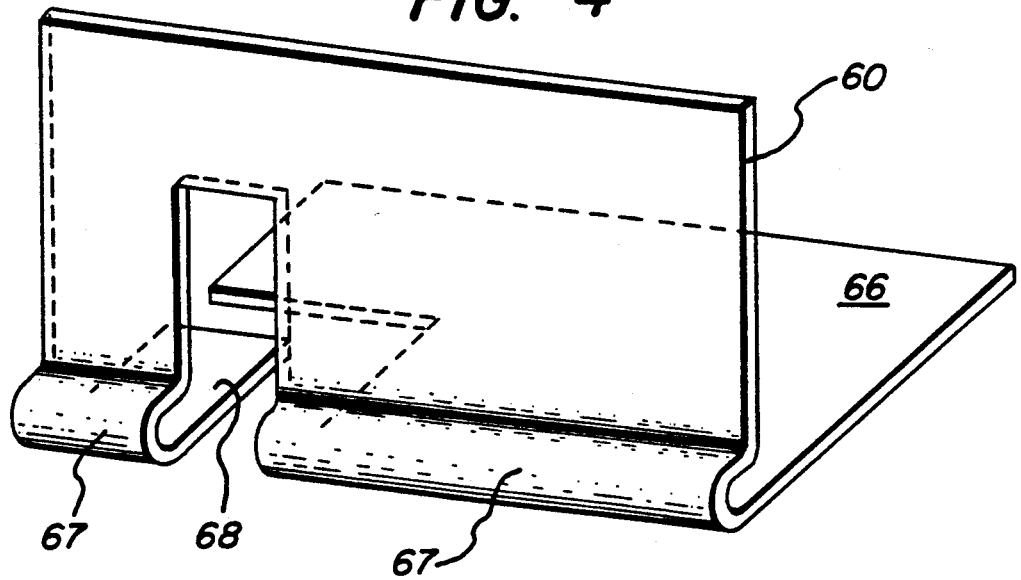
FIG. 4 illustrates the lead frame after forming.

In FIG. 4, the lead frame 60 has been formed or bent to place the lead portions of the lead frame in proper position relative to the contact portions 66 and 68 of the frame and to provide a strain relief bend 67 in each of the lead portions to reduce stresses which are induced by temperature cycling of the final packaged device.

Figure 5:
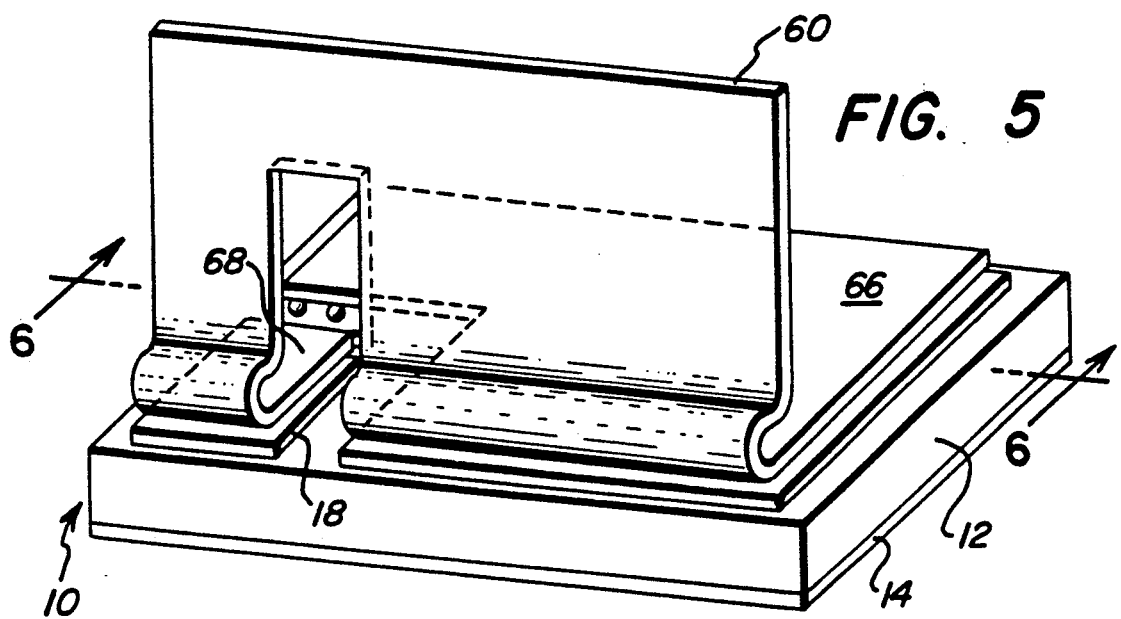
FIG. 5 illustrates the lead frame bonded to the contact pads on the upper surface of the device.

In FIG. 5, the lead frame 60 is shown positioned on and bonded to the contact pads of the chip 10. In this configuration, the lead frame electrically connects the pad 16 to the pad 18 through the connecting portion of the lead frame.

Figure 6:
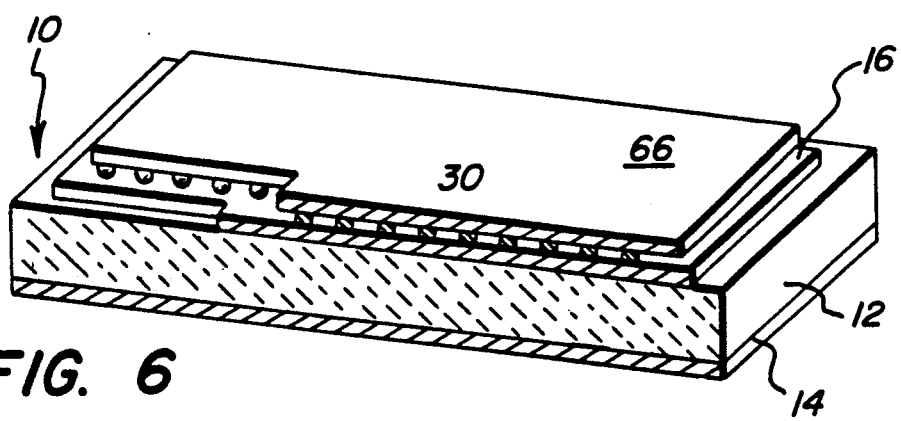
FIG. 6 is a cross-section through the FIG. 5 structure taken along the line 6—6.

FIG. 6 is a cross-section through the structure of FIG. 5 taken along the line 6—6. As is seen in FIG. 6, the individual gold bumps 30 remain distinct from each other after the thermocompression bonding of the leads to the contact pads. However, the gold bumps now have a flat upper surface disposed in intimate contact with the lead frame portion 66. It will be understood, that while straight thermocompression bonding is preferred, a thermosonic or ultrasonic bond may be utilized.

Figure 7:
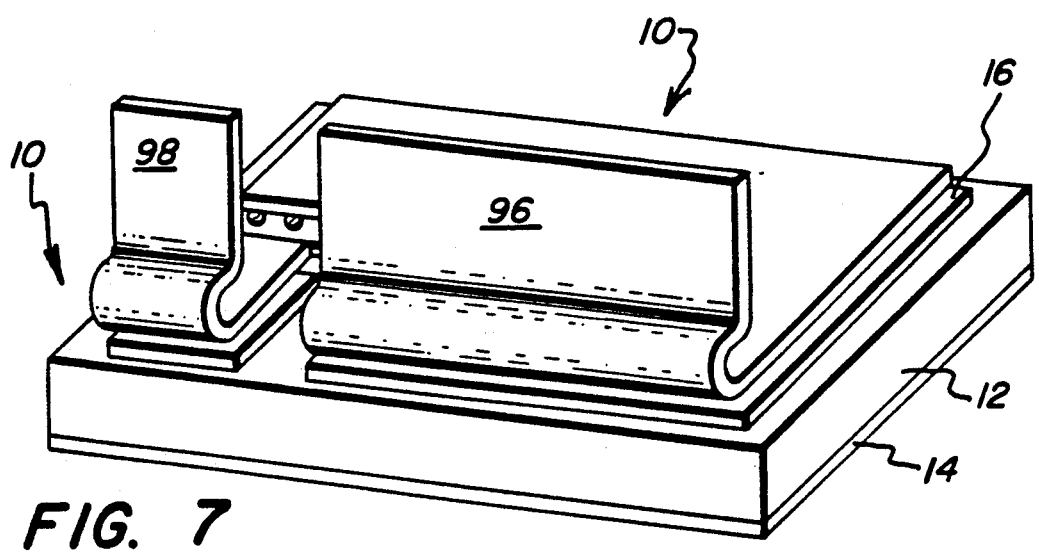
FIG. 7 illustrates the chip with the leads bonded thereto after severing of the individual leads from the lead frame.

In FIG. 7, the chip 10 with the leads bonded thereto is illustrated after severing of the lead frame 60 to separate the lead frame into separate leads or terminals 96 and 98.

Figure 8:
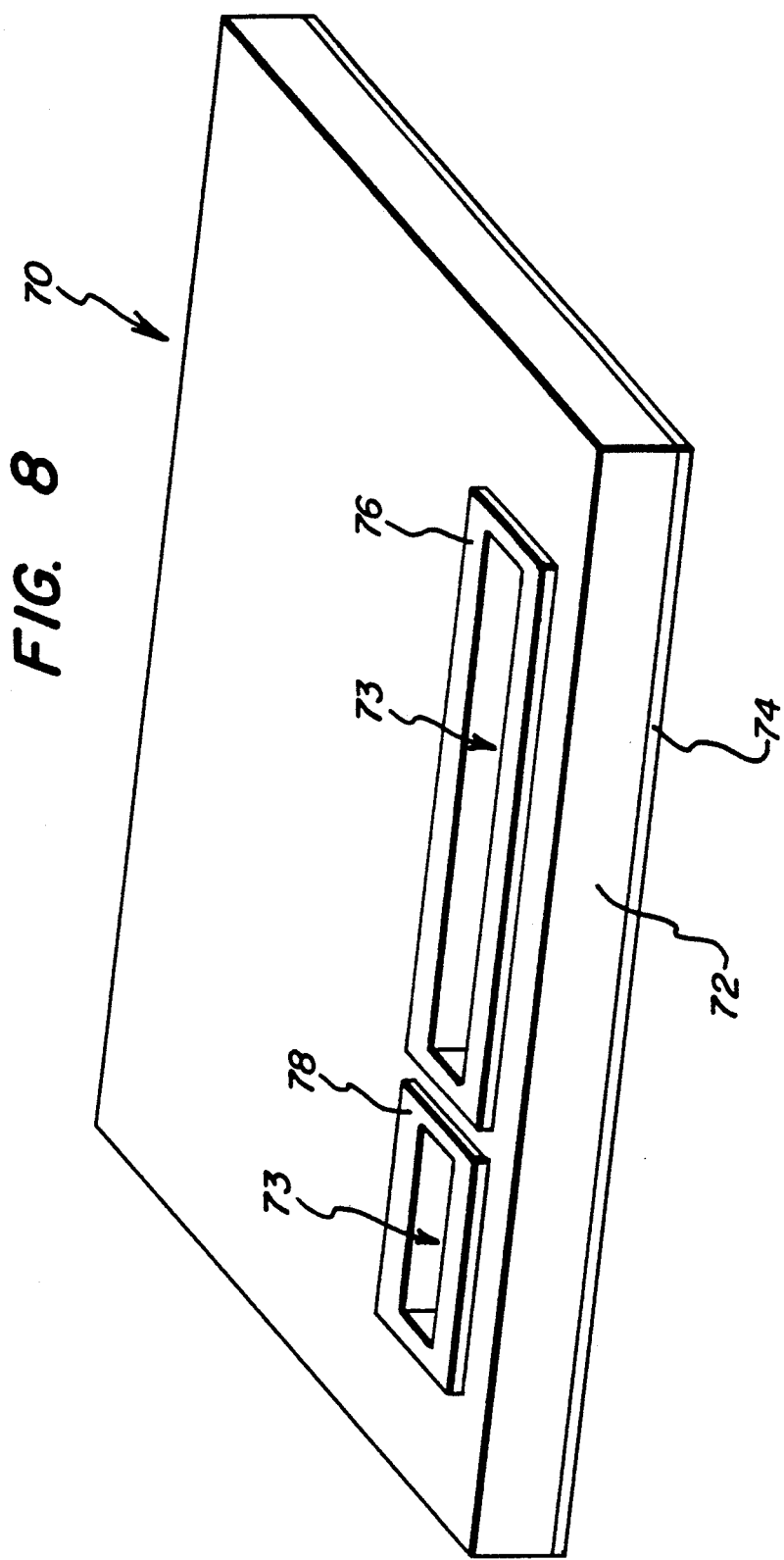
FIGS. 8 and 9 illustrate, respectively, the outer and inner surfaces of the lid of the package.
Figure 9:
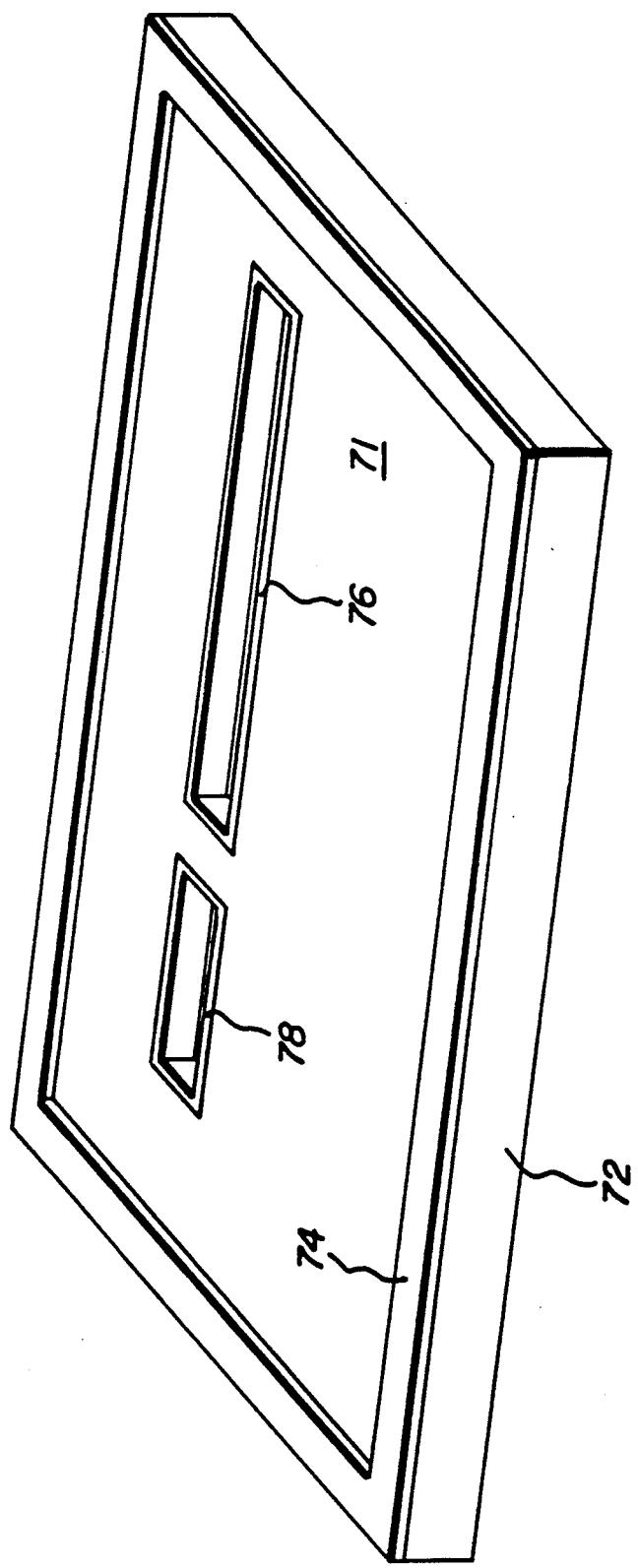

A lid for this package is illustrated in FIGS. 8 and 9. In FIG. 8, the outer surface of the lid is shown upward, while in FIG. 9, the inner surface of the lid is shown upward. The lid 70 has two apertures 73 therein in order to match the structure shown in FIG. 7. Each of the apertures 73 is a slot configured for a reasonably tight tolerance fit with a corresponding one of the leads 96 and 98 in their bonded-to-the-chip configurations. In the illustrated embodiment the apertures 73 are elongated and have rectangular configurations which match the configurations of the corresponding leads. Thus, at least for the large area lead 96, the area of the corresponding aperture 73 is substantially smaller than the area of the contact pad 16 to which the lead 96 is bonded. Each of the apertures 73 has a region of metallization surrounding it. This metallization is preferably copper foil which has been solderless bonded to the ceramic plate 72 of the lid, although any other technique for providing a solderable metallization on the lid may be used. This copper foil is preferably on the order of 1-25 mils (0.025-0.63 mm) thick and is preferably direct bonded to the ceramic substrate 72 by the direct bond copper process described in U.S. Pat. No. 3,744,120 to Burgess et al., U.S. Pat. No. 3,766,634 to Babcock et al., U.S. Pat. Nos. 3,854,892 and 3,911,553 to Burgess et al., U.S. Pat. Nos. 3,994,430 and 4,129,243 to Cusano et al., U.S. Pat. No. 4,563,383 to Kuneman et al. Each of these patents is incorporated herein by reference. Alternatively, the copper foil could be brazed to the ceramic using the molybdenum manganese process, for instance. The only limitation on the process used to bond the foil to the ceramic being that a hermetic seal must be produced for a hermetic package.

In order for the package 90 to be hermetically sealed, the conductive foils 76 and 78 must provide a hermetic seal enclosing the apertures 73 within the package. For this purpose, it is preferred to have each of the apertures positioned 100 mils or more from the nearest edge of the foil terminal which covers it. This is because we have found that in direct bonding copper to alumina plates, a direct bond distance of 100 mils essentially ensures the provision of a hermetic seal every time. As the length of the shortest path from the aperture to the edge of the foil terminal decreases, the yield percentage of hermetically sealed lids decreases. Consequently, the 100 mils distance is not a hard and fast limit, but is a desirable one where the package configuration permits its use, since it makes pretesting of lids for hermetic seals unnecessary. This distance may be shortened where necessary, with an attendant yield loss or, if improved methods of direct bonding are developed, may be shortened as the path length needed to ensure a hermetic seal decreases. The hermetic seal may be provided any place between the chip and the outside surface of the package, including within the aperture or inside the package. Other means of forming the metallizations 76 and 78 may also be used.

As used in this specification and the appended claims, "solderless bond or solderless bonded" means without solder, i.e. a direct bond. Thus, solderless bonded includes thermocompression bonded, ultrasonically bonded, thermosonically bonded, diffusion bonded, cold welded, resistance welded, laser welded, spot welded, direct bond copper and any other similar bonding process. The term "direct bonded" is used to refer to the direct bond copper process described in the patents listed above.

In FIGS. 8 and 9, the foil metallization surrounding the larger aperture is identified by the reference numeral 76, while the metallization surrounding the smaller aperture is identified by the reference numeral 78. Also visible in FIG. 8, but shown more clearly in FIG. 9, is a frame 74 around the periphery of the inner surface of the lid 70. The frame 74 is preferably copper foil which has been solderless bonded to the ceramic lid 72. The frame 74 is used in sealing the lid to a base to be described subsequently. In the FIG. 9 view, portions of the metallizations 76 and 78 which extend into the apertures along the aperture walls are visible from the inside of the package where they extend to the inner surface 71 of the ceramic plate 72. This extension of the foils into the apertures is desirable, but not required.

Figure 10:
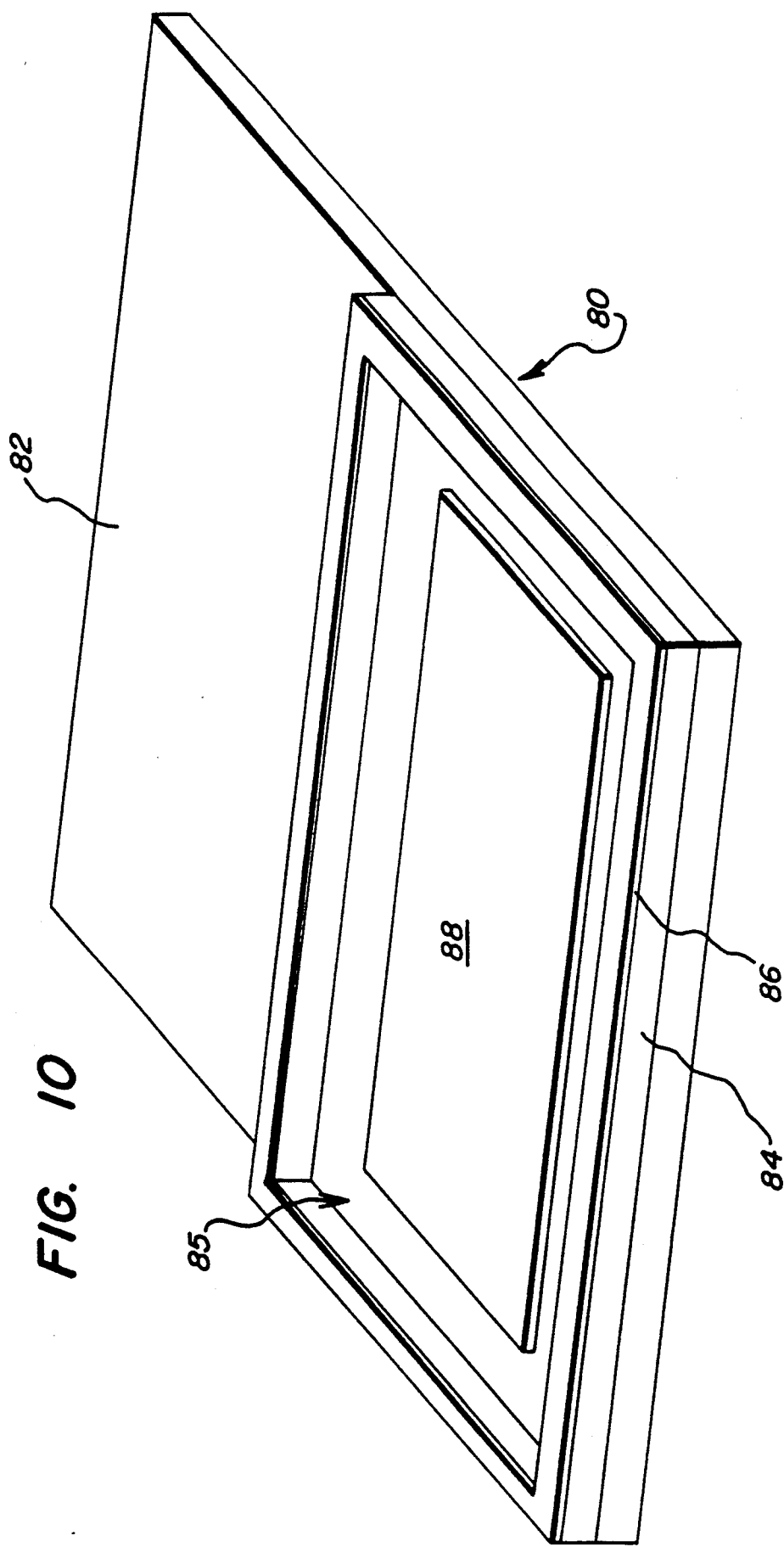
FIG. 10 is a perspective illustration of a base for the package.

In FIG. 10, a base 80 for the package is illustrated. This base comprises a base plate 82 having a frame 84 solderless bonded thereto which will mate with the frame 74 of the lid 70. The height of the frame 84 is selected in accordance with the desired height of the cavity in which the semiconductor chip will be enclosed. This height must be sufficient to accommodate the chip 10 and the strain-relief bend portions of the terminals 96 and 98. A layer of solder 86 is positioned on the upper surface of the frame 84 in preparation for sealing the package by bonding the lid to the base. A rectangular solder layer 88 is positioned within the cavity 85 on the plate 82 in the location where the chip 10 is to be bonded to the base 80.

Figure 11:
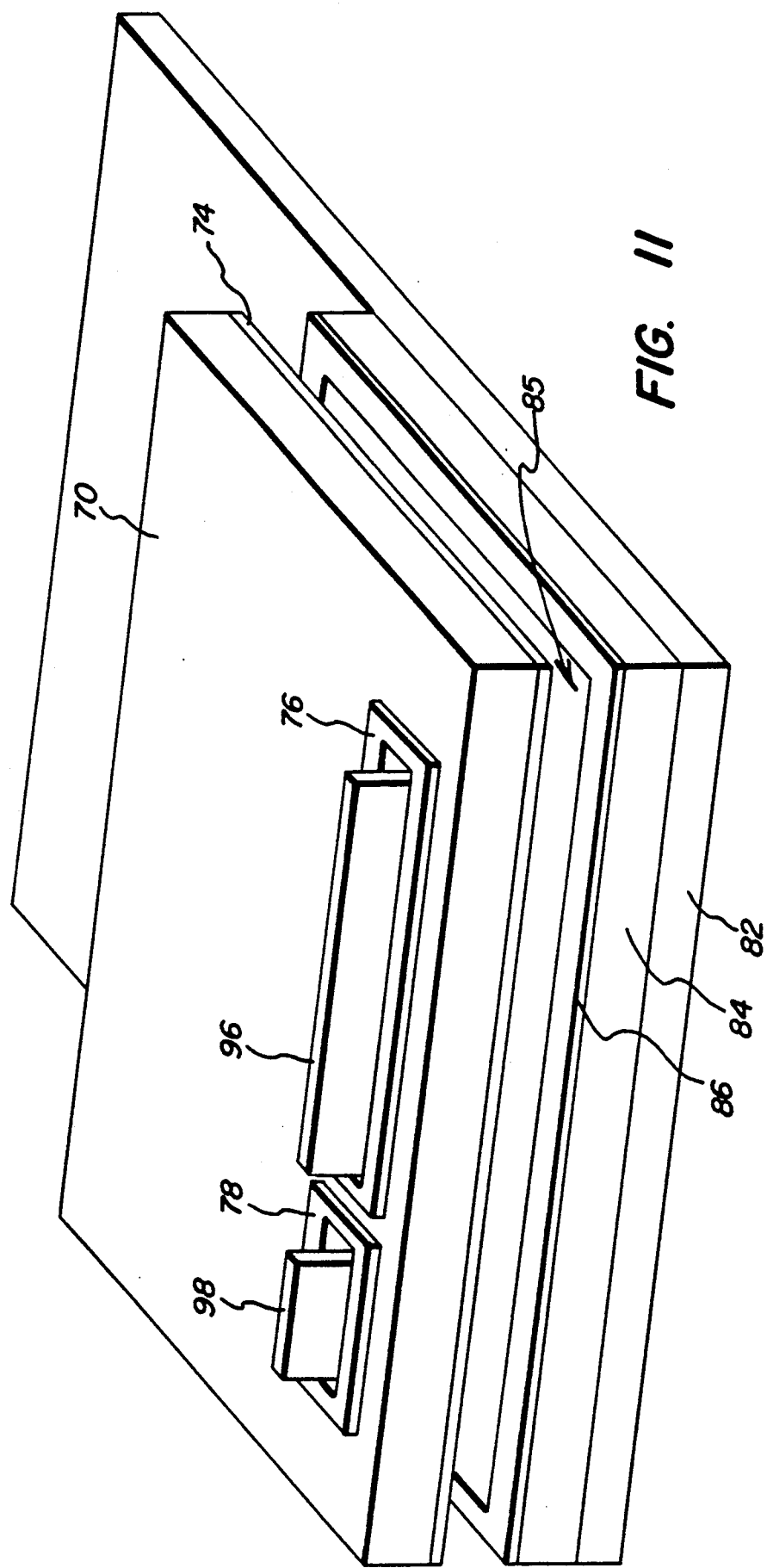
FIG. 11 is a slightly exploded view of the semiconductor chip bonded to the base of the package with the lid aligned with, but displaced from its final position.

In FIG. 11, the chip 10 is shown in position on the base 80 with the lid 70 positioned with the leads 96 and 98 extending through the apertures 73, but with the lid frame 74 not yet in contact with the solder 86.

Figure 12:
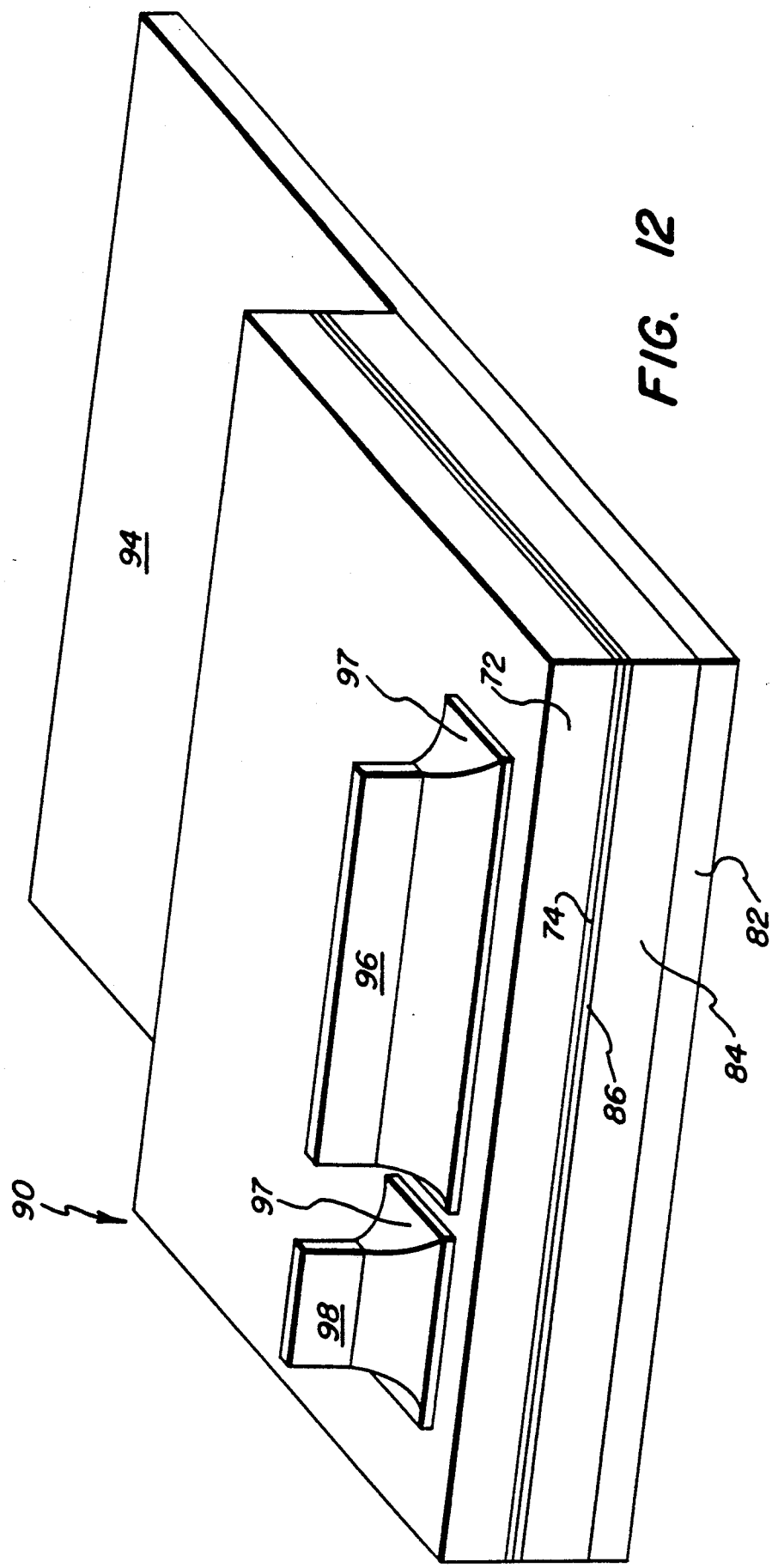
FIG. 12 is a perspective illustration of the finished package.

In FIG. 12, the package is shown in its sealed configuration with the solder layer 86 bonding the lid frame 74 to the base frame 84. Each of the apertures 73 is sealed by a layer of solder 97 which bridges from the metallization 76 or 78 to the lead 96 or 98, respectively. Once sealed in this configuration, the package provides a packaged high current semiconductor device in a hermetic package which is free of magnetic materials and only slightly larger in major surface area than the chip itself since the leads extend vertically through the lid of the package rather than laterally through the walls of the package which would increase the overall package size. The extension of the base plate 82 beyond the frame 84 serves as a third lead or terminal for the device. If desired, this plate may be bent up to provide three leads, all of which extend vertically upward relative to the major surface of the semiconductor device to facilitate insertion of the leads into a socket or a circuit board. Alternatively, where it is intended to solder the base of the package to a heat sink or other mounting structure, the extension of the base plate 82 beyond the frame 84 may be omitted to provide a more compact package.

Referring now to FIGS. 2 and 5, it can be seen that the maximum distance which current will flow laterally in the contact pad 16 or 18 is the maximum distance by which a portion of that contact pad is spaced from one of the conductive bumps which is bonded to the corresponding lead 96 or 98. Consequently, essentially any desired maximum distance may be established by appropriate selection of the number and position of the conductive gold bumps 30 disposed on a contact pad and the configuration of the lead frame 60 and the location in which that lead frame contacts those pads. Thus, it is possible to design this chip and package in a manner which ensures that any appropriate limit on maximum current flowing laterally in the pad 16 is not exceeded.

As an alternative to thermocompression bonding the leads 96 and 98 to the contact pads 16 and 18, these leads may be soldered using a high temperature solder provided the contact pads 16 and 18 have solderable surfaces or are provided with the gold bumps 30, which are themselves solderable. However, unless the leads are held in place by a mechanical fixture during the sealing of the package, a lower temperature solder would need to be used for soldering or sealing the package. Further, while wide, flat leads are preferred, the portion of the lead which extends through the lid may be round rather than flat, if the resulting inductance can be tolerated.

Figure 13:
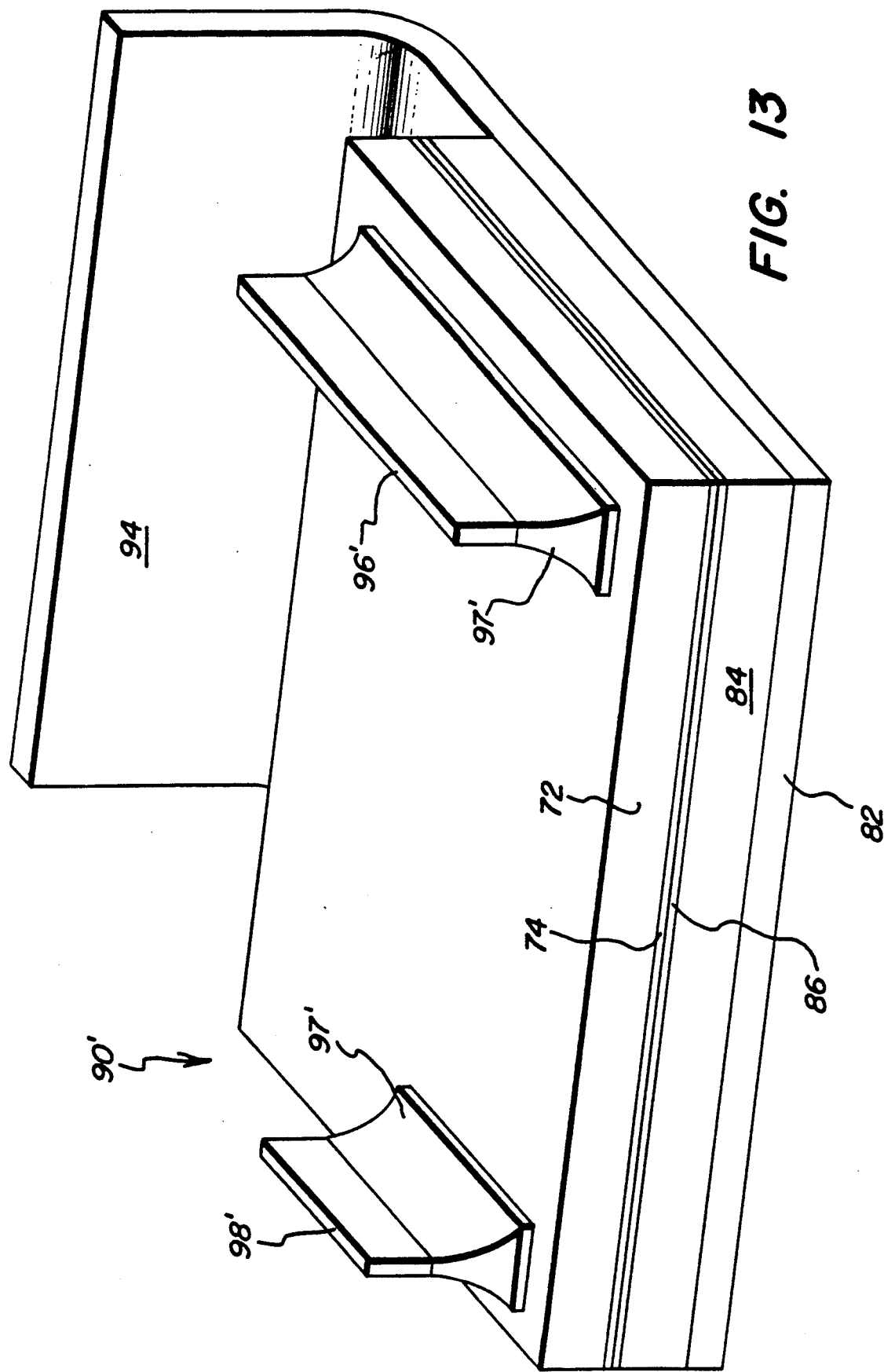
FIGS. 13 and 14 illustrate alternative package configurations.
Figure 14:
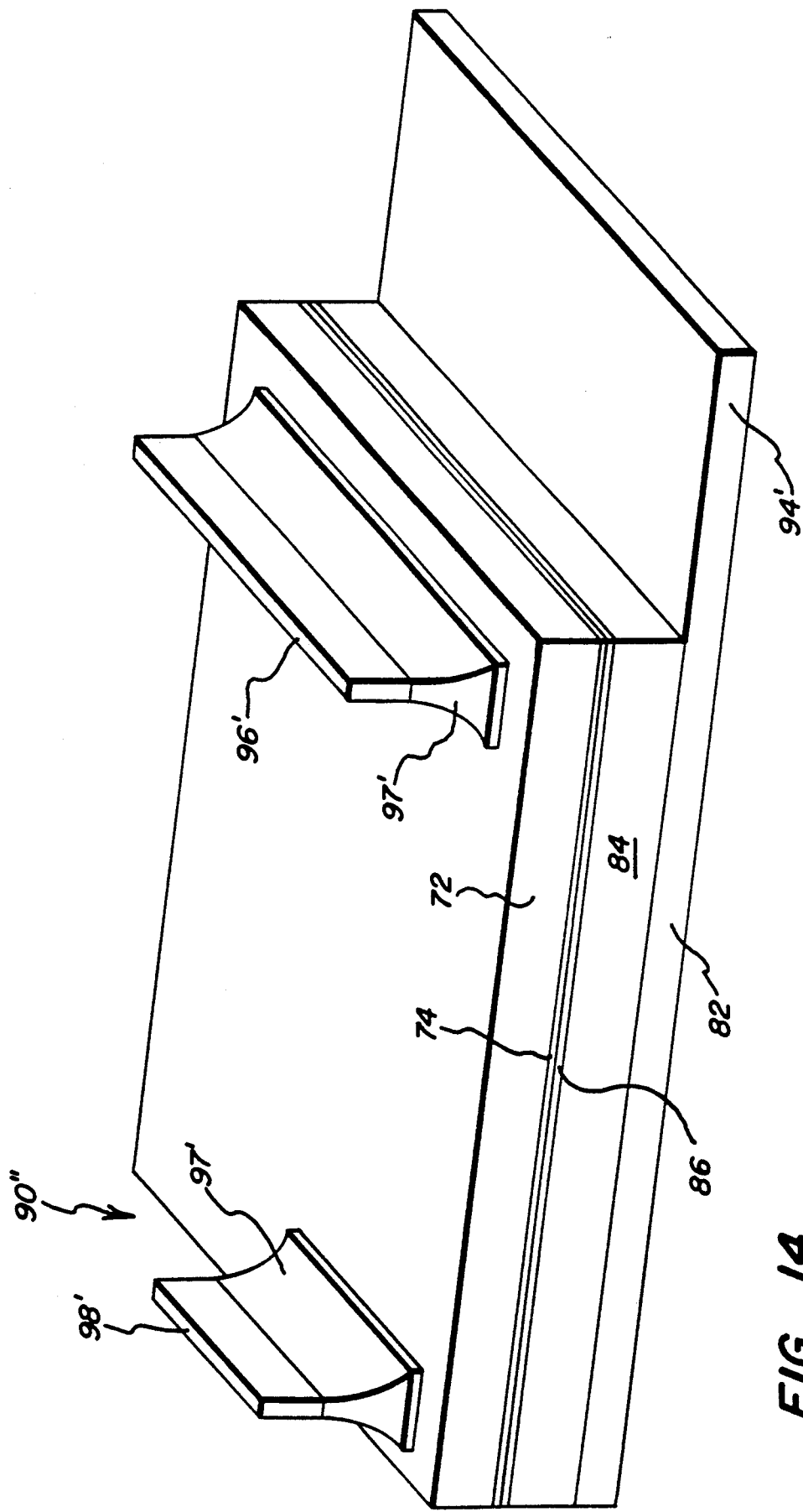

Two alternative packages 90′ and 90″ are illustrated, respectively, in FIGS. 13 and 14. In package 90 of FIG. 12, leads 96 and 98 are disposed in a common plane. In packages 90′ and 90″, the leads 96′ and 98′ are disposed in parallel, spaced apart planes. In package 90′, lead 94 is bent up to provide a pluggable package. In package 90″, if lead 94′ is bent up like lead 94 in package 90′, three parallel leads are provided. The configuration of leads 96′ and 98′ has the advantage of providing a greater separation between the leads and thus, allows use of a larger foil surrounding the apertures in the lid, thereby providing an increased yield of hermetic packages when the packages are small. In either package 90′ or 90″, the lead 98′ could be replaced by a lead 98 as in FIG. 12. Other lead location/orientation combinations may be used. The primary disadvantage of the lead configuration 96′ and 98′ is that it makes use of a conventional "planar" lead frame less desirable.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A packaged semiconductor chip comprising:
a contract pad on a first major surface of said chip;
a package base;
said chip being bonded to said package base;
an electrically insulating non-glass lid having an elongated aperture therein;
a flat conductor bonded to said contact pad and electrically continuous with a flat external terminal of said package;
said external terminal extending through said elongated aperture in said lid; and
said aperture and said lid being non-glass hermetically sealed and said lid being non-glass hermetically sealed to said package base to hermetically seal said chip in said package.

2. The packaged chip recited in claim 1 wherein said flat conductor comprises said external terminal.

3. The packaged chip recited in claim 2 wherein:
said flat conductor includes a strain relief bend therein between the portion thereof which is bonded to said contact pad and the portion thereof which extends through said aperture.

4. The packaged chip recited in claim 2 wherein:
said aperture is a slot.

5. The packaged chip recited in claim 2 wherein:
said lid includes metallization surrounding said aperture; and
said aperture is sealed with solder which bonds said flat conductor to said surrounding metallization.

6. The packaged chip recited in claim 5 wherein:
said metallization is disposed on the wall of said aperture.

7. The packaged chip recited in claim 6 wherein:
said metallization extends onto the outer major surface of said lid.

8. The packaged chip recited in claim 5 wherein:
said metallization is disposed on a major surface of said lid.

9. A packaged semiconductor chip comprising:
a plurality of contact pads on a first surface of said chip;
a package base;
an insulating lid having first and second major surfaces and a plurality of apertures therein extending from said first major surface to said second major surface;
an array of conductive bumps bonded to each of said contact pads;
a plurality of external leads, each bonded to a different one of said contact pads by said conductive bumps disposed on that contact pad;
each of said external leads extending through one of said apertures in said lid;
each of said apertures being hermetically sealed; and
each lid being hermetically sealed to said base to hermetically seal said chip in said package.

10. The packaged chip recited in claim 9 wherein:
said lid includes metallization surrounding each of said apertures;
each of said apertures is sealed with solder which bonds the external lead extending therethrough to said metallization surrounding that aperture.

11. The packaged chip recited in claim 10 wherein:
at least one of said external leads is flat; and
the one of said apertures through which said flat lead extends is a slot.

12. The packaged chip recited in claim 10 wherein:
at least one of said apertures has said metallization disposed on the wall thereof.

13. The packaged chip recited in claim 12 wherein said metallization extends from said wall of said aperture onto said second major surface of said lid.

14. The packaged chip recited in claim 9 wherein:
said chip is bonded to said package base.

15. An electrically insulating lid for a semiconductor device package comprising:
a ceramic substrate having an elongated aperture therein;
solderable metallization surrounding said elongated aperture and sealingly adhered to said substrate;
said elongated aperture configured for insertion of a flat lead therein during package assembly.

16. The packaged chip recited in claim 1 wherein:
said flat conductor is substantially coextensive with said contact pad.

17. The packaged chip recited in claim 9 wherein:
said conductor is bonded to said contact pad at locations distributed across said contact pad in a substantially uniform manner.

18. The lid recited in claim 15 wherein said elongated aperture is substantially rectangular.

19. A packaged semiconductor chip comprising:
 a contact pad on a first major surface of said chip, said contact pad having a plurality of conductive bumps disposed thereon;
 a package base;
 said chip being bonded to said contact pad via said conductive bumps;
 an electrically insulating lid having an elongated aperture therein;
 a flat conductor bonded to said contact pad and electrically continuous with a flat external terminal of said package;
 said external terminal extending through said elongated aperture in said lid; and
 said aperture and said lid being hermetically sealed and said lid being hermetically sealed to said package base to hermetically seal said chip in said package.

20. A packaged semiconductor chip comprising:
 a contact pad on a first major surface of said chip;
 a package base;
 said chip being bonded to said package base;
 an electrically insulating lid having an elongated aperture therein;
 a flat conductor bonded to said contact pad and electrically continuous with a flat external terminal of said package, said flat conductor having a substantially greater lateral current carrying capacity than said contact pad;
 said external terminal extending through said elongated aperture in said lid; and
 said aperture in said lid being hermetically sealed and said lid being hermetically sealed to said package base to hermetically seal said chip to said package.

21. An electrically insulating lid for a semiconductor device package comprising:
 a ceramic substrate having an elongated aperture therein;
 solderable metallization surrounding said elongated aperture and sealingly adhered to said substrate;
 a solderable flat lead extending through said aperture and spaced from portions of the wall of said aperture; and
 a solder fillet hermetically sealing said aperture and extending from said lead to said metallization.

22. The packaged chip recited in claim 19 wherein:
 said conductive bumps are disposed on said pad in a pattern which extends across an area which is substantially larger than the area of said aperture.

23. The packaged chip recited in claim 22 wherein:
 said flat conductor disposed within said package has a substantially greater lateral current carrying capacity than said contact pad.

24. The packaged chip recited in claim 23 wherein:
 said flat conductor comprises a metal foil.

25. The packaged chip recited in claim 20 wherein:

* * * * *